United States Patent
Shimizu

(10) Patent No.: US 11,329,134 B2
(45) Date of Patent: May 10, 2022

(54) METHOD FOR MANUFACTURING SEMICONDUCTOR DEVICE

(71) Applicant: KABUSHIKI KAISHA TOSHIBA, Minato-ku (JP)

(72) Inventor: Tatsuo Shimizu, Shinagawa (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 191 days.

(21) Appl. No.: 16/790,817

(22) Filed: Feb. 14, 2020

(65) Prior Publication Data
US 2021/0083062 A1    Mar. 18, 2021

(30) Foreign Application Priority Data
Sep. 17, 2019   (JP) .............................. JP2019-168776

(51) Int. Cl.
| | | |
|---|---|---|
| H01L 21/3205 | (2006.01) | |
| H01L 29/40 | (2006.01) | |
| H01L 29/16 | (2006.01) | |
| H01L 21/04 | (2006.01) | |
| H01L 21/02 | (2006.01) | |
| H01L 29/66 | (2006.01) | |

(52) U.S. Cl.
CPC ...... *H01L 29/408* (2013.01); *H01L 21/02164* (2013.01); *H01L 21/049* (2013.01); *H01L 29/1608* (2013.01); *H01L 29/66068* (2013.01)

(58) Field of Classification Search
CPC ............ H01L 29/408; H01L 21/02164; H01L 21/049; H01L 29/1608; H01L 29/66068
See application file for complete search history.

(56) References Cited

U.S. PATENT DOCUMENTS

| | | | |
|---|---|---|---|
| 2012/0199846 A1 | 8/2012 | Shimizu et al. | |
| 2016/0315186 A1* | 10/2016 | Kinoshita | H01L 29/41775 |
| 2017/0069487 A1 | 3/2017 | Watanabe et al. | |
| 2018/0308937 A1 | 10/2018 | Hirose et al. | |
| 2019/0279862 A1* | 9/2019 | Park | H01L 21/02216 |

FOREIGN PATENT DOCUMENTS

| | | |
|---|---|---|
| JP | 2012-164788 A | 8/2012 |
| JP | 2017-055098 A | 3/2017 |
| JP | 2017-168688 A | 9/2017 |
| JP | 2018-186140 A | 11/2018 |

OTHER PUBLICATIONS

Wang et al., "Interface Properties of 4H—SiC/SiO$_2$ with MOS Capacitors and FETs annealed in O$_2$, N$_2$O, NO and CO$_2$", Materials Science Forum, vols. 457-460, 2004, pp. 1309-1312.

Arai et al., "Angle-resolved photoelectron spectroscopy study of initial stage of thermal oxidation on 4H—SiC (0001)", Japanese Journal of Applied Physics 55, 04EB04, 2016, 6 pages.

* cited by examiner

*Primary Examiner* — Victor A Mandala
*Assistant Examiner* — Colleen E Snow
(74) *Attorney, Agent, or Firm* — Oblon, McClelland, Maier & Neustadt, L.L.P.

(57) ABSTRACT

A method for manufacturing a semiconductor device according to an embodiment includes: forming a first silicon oxide film on a surface of a silicon carbide layer; and performing first heat treatment at 1200° C. or more in an atmosphere including nitrogen gas and carbon dioxide gas.

17 Claims, 9 Drawing Sheets

METHOD FOR MANUFACTURING SEMICONDUCTOR DEVICE

CROSS-REFERENCE TO RELATED APPLICATION

This application is based upon and claims the benefit of priority from Japanese Patent Application No. 2019-168776, filed on Sep. 17, 2019, the entire contents of which are incorporated herein by reference.

FIELD

Embodiments described herein relate generally to a method for manufacturing a semiconductor device.

BACKGROUND

Silicon carbide (SiC) is expected as a material for next-generation semiconductor devices. As compared with silicon (Si), silicon carbide has superior physical properties such as a threefold band gap, approximately tenfold breakdown field strength, and approximately threefold thermal conductivity. By using these characteristics, a semiconductor device in which low loss and high-temperature operation can be realized.

However, for example, when a metal oxide semiconductor field effect transistor (MOSFET) is formed using silicon carbide, there is a problem that the mobility of carriers is lowered. One factor lowering the mobility of the carriers is considered to be an interface state (surface state) existing at an interface between a silicon carbide layer and a gate insulating layer.

DETAILED DESCRIPTION

Figure 1:
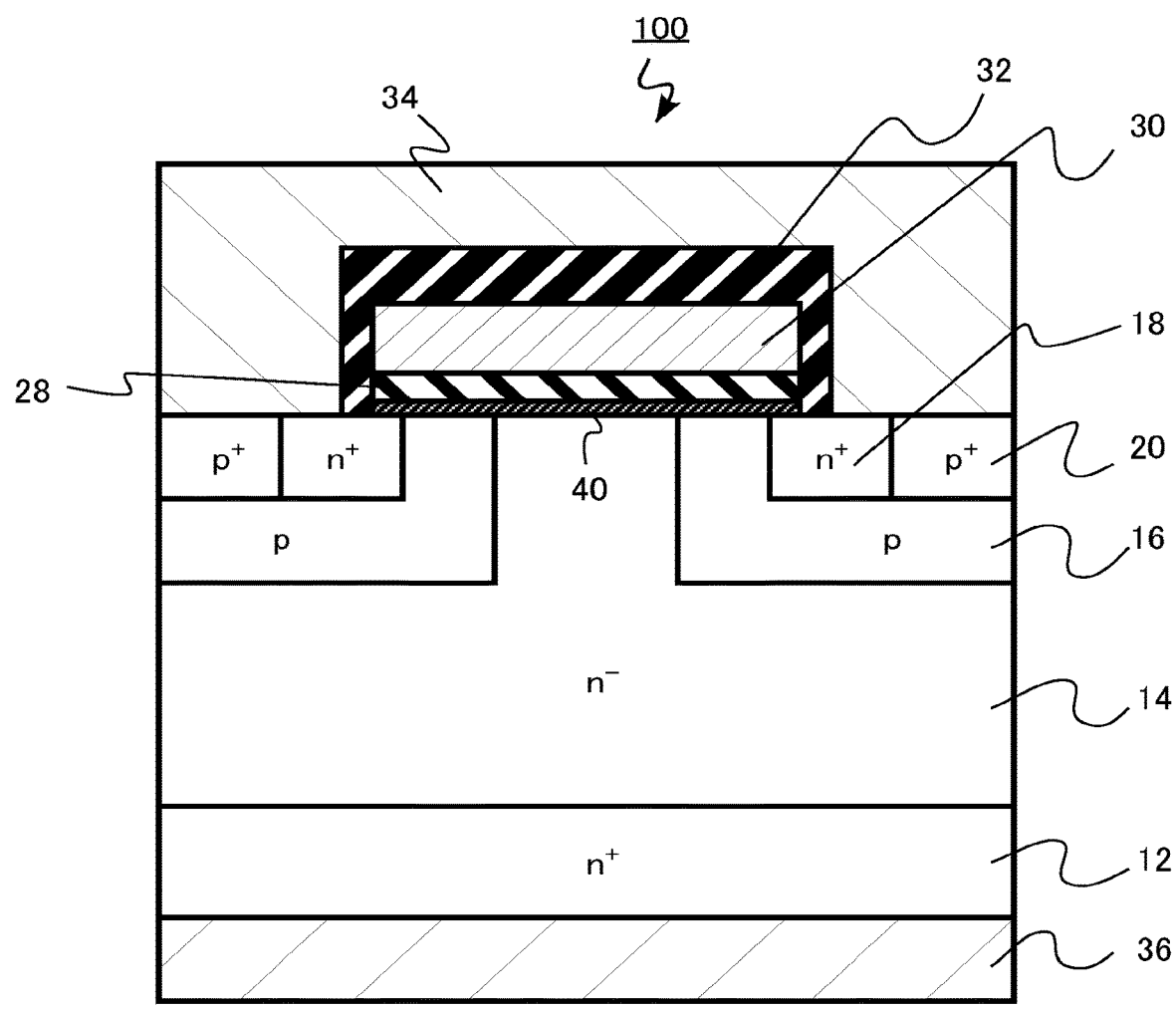
FIG. 1 is a schematic cross-sectional view of a semiconductor device manufactured by a method for manufacturing a semiconductor device according to a first embodiment.

A method for manufacturing a semiconductor device according to an embodiment includes: forming a first silicon oxide film on a surface of a silicon carbide layer; and performing first heat treatment at 1200° C. or more in an atmosphere including nitrogen gas and carbon dioxide gas.

Hereinafter, embodiments of the present disclosure will be described with reference to the drawings. In the following description, the same or similar members are denoted by the same reference numerals and the description of the members described once is appropriately omitted.

In addition, in the following description, notations $n^+$, n, $n^-$, $p^+$, p, and $p^-$ represent the relative magnitudes of impurity concentrations in respective conductive types. That is, an n-type impurity concentration of n is relatively higher than an n-type impurity concentration of n and an n-type impurity concentration of n is relatively lower than the n-type impurity concentration of n. In addition, a p-type impurity concentration of $p^+$ is relatively higher than a p-type impurity concentration of p and a p-type impurity concentration of p is relatively lower than the p-type impurity concentration of p. The $n^+$ type and the $n^-$ type may be simply described as the n types and the $p^+$ type and the $p^-$ type may be simply described as the p types.

First Embodiment

A method for manufacturing a semiconductor device according to a first embodiment includes: forming a first silicon oxide film on a surface of a silicon carbide layer, performing first heat treatment at 1200° C. or more in an atmosphere including nitrogen gas and carbon dioxide gas, and forming a gate electrode on the first silicon oxide film after the first heat treatment.

FIG. 1 is a schematic cross-sectional view of a semiconductor device manufactured by the method for manufacturing the semiconductor device according to the first embodiment. The semiconductor device is a MOSFET 100. The MOSFET 100 is a double implantation MOSFET (DIMOSFET) in which a p-well and a source region are formed by ion implantation. Further, the MOSFET 100 is an n-channel MOSFET using electrons as carriers.

The MOSFET 100 includes a silicon carbide substrate 12, a drift layer 14 (silicon carbide layer), a p-well region 16 (silicon carbide layer), a source region 18, a p-well contact region 20, a gate insulating layer 28, a gate electrode 30, an interlayer insulating film 32, a source electrode 34, a drain electrode 36, and an interface termination region 40.

The silicon carbide substrate 12 is, for example, an $n^+$-type 4H—SiC substrate. The silicon carbide substrate 12 includes nitrogen (N) as n-type impurities, for example. An n-type impurity concentration of the silicon carbide substrate 12 is, for example, equal to or more than $1 \times 10^{18}$ cm$^{-3}$ and equal to or less than $1 \times 10^{20}$ cm$^{-3}$.

Figure 2:
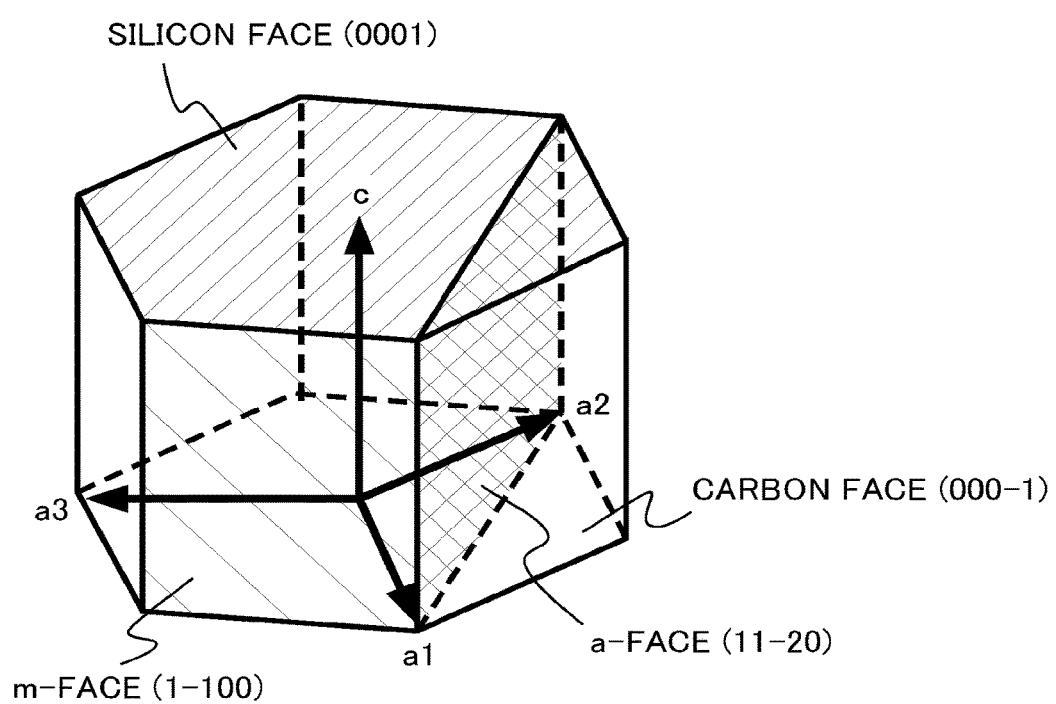
FIG. 2 is a diagram showing a crystal structure of a SiC semiconductor.

FIG. 2 is a diagram showing a crystal structure of a SiC semiconductor. A typical crystal structure of the SiC semiconductor is a hexagonal crystal system such as 4H—SiC. One of faces (top faces of a hexagonal column) with a c-axis along an axial direction of the hexagonal column as a normal is a (0001) face. A face equivalent to the (0001) face is referred to as a silicon face (Si-face) and expressed as a {0001} face. Silicon atoms (Si) are arranged on an outermost face of the silicon face.

The other of the faces (top faces of the hexagonal column) with the c-axis along the axial direction of the hexagonal column as the normal is a (000-1) face. A face equivalent to the (000-1) face is referred to as a carbon face (C-face) and expressed as a {000-1} face. Carbon atoms (C) are arranged on an outermost face of the carbon face.

On the other hand, a side face (column face) of the hexagonal column is an m-face to be a face equivalent to a (1-100) face, that is, a {1-100} face. Further, a face passing through a pair of ridge lines not adjacent to each other is an a-face to be a face equivalent to a (11-20) face, that is, a {11-20} face. Both silicon atoms (Si) and carbon atoms (C) are arranged on outermost faces of the m-face and the a-face.

Hereinafter, a case where a surface of the silicon carbide substrate 12 is a face inclined by equal to or more than 0 and equal to or less than 8 degrees with respect to the silicon face and a back face is a face inclined by 0 to 8 degrees with respect to the carbon face will be described as an example. The face of the silicon carbide substrate 12 has an off angle of 0 to 8 degrees with respect to the silicon face.

The drift layer 14 is provided on the surface of the silicon carbide substrate 12. The drift layer 14 is an n⁻-type silicon carbide layer. The drift layer 14 includes nitrogen as n-type impurities, for example.

An n-type impurity concentration of the drift layer 14 is, for example, equal to or more than $5 \times 10^{19}$ cm$^{-3}$ and equal to or less than $2 \times 10^{16}$ cm$^{-3}$. The drift layer 14 is, for example, a SiC epitaxial growth layer formed on the silicon carbide substrate 12 by epitaxial growth.

A surface of the drift layer 14 is also a face inclined by equal to or more than 0 and equal to or less than 8 degrees with respect to the silicon face. The thickness of the drift layer 14 is, for example, equal to or more than 5 μm and equal to or less than 100 μm.

The p-well region 16 is provided on a partial surface of the drift layer 14. The p-well region 16 is a p-type silicon carbide region. The p-well region 16 includes aluminum (Al) as p-type impurities, for example. A p-type impurity concentration of the p-well region 16 is, for example, equal to or more than $5 \times 10^{15}$ cm$^{-3}$ and equal to or less than $1 \times 10^{17}$ cm$^{-3}$.

The depth of the p-well region 16 is, for example, equal to or more than 0.4 μm and equal to or less than 0.8 μm. The p-well region 16 functions as a channel region of the MOSFET 100.

A surface of the p-well region 16 is also a face inclined by equal to or more than 0 and equal to or less than 8 degrees with respect to the silicon face.

The source region 18 is provided on a partial surface of the p-well region 16. The source region 18 is an n⁺-type silicon carbide layer. The source region 18 includes phosphorus (P) as n-type impurities, for example. An n-type impurity concentration of the source region 18 is, for example, equal to or more than $1 \times 10^{1}$ cm$^{-3}$ and equal to or less than $1 \times 10^{2}$ cm$^{-3}$.

The depth of the source region 18 is shallower than the depth of the p-well region 16. The depth of the source region 18 is, for example, equal to or more than 0.2 μm and equal to or less than 0.4 μm.

The p-well contact region 20 is provided on a partial surface of the p-well region 16. The p-well contact region 20 is provided on the side of the source region 18. The p-well contact region 20 is a p⁺-type silicon carbide region.

The p-well contact region 20 includes aluminum as p-type impurities, for example. A p-type impurity concentration of the p-well contact region 20 is, for example, equal to or more than $1 \times 10^{18}$ cm$^{-3}$ and equal to or less than $1 \times 10^{22}$ cm$^{-3}$.

The depth of the p-well contact region 20 is shallower than the depth of the p-well region 16. The depth of the p-well contact region 20 is, for example, equal to or more than 0.2 μm and equal to or less than 0.4 μm.

The gate insulating layer 28 is provided between the drift layer 14 and the p-well region 16 and the gate electrode 30. The gate insulating layer 28 is provided on the drift layer 14 and the p-well region 16. The gate insulating layer 28 is continuously formed on the surfaces of the drift layer 14 and the p-well region 16.

The gate insulating layer 28 is, for example, silicon oxide. For example, the gate insulating layer 28 may include nitrogen as an additive element.

The thickness of the gate insulating layer 28 is, for example, equal to or more than 30 nm and equal to or less than 100 nm. The gate insulating layer 28 functions as a gate insulating layer of the MOSFET 100. The thickness of the gate insulating layer 28 is, for example, equal to or more than 40 nm and equal to or less than 50 nm.

The interface termination region 40 is located between the drift layer 14 and the p-well region 16 and the gate insulating layer 28. The interface termination region 40 includes nitrogen (N) as a termination element terminating a dangling bond.

Figure 3:
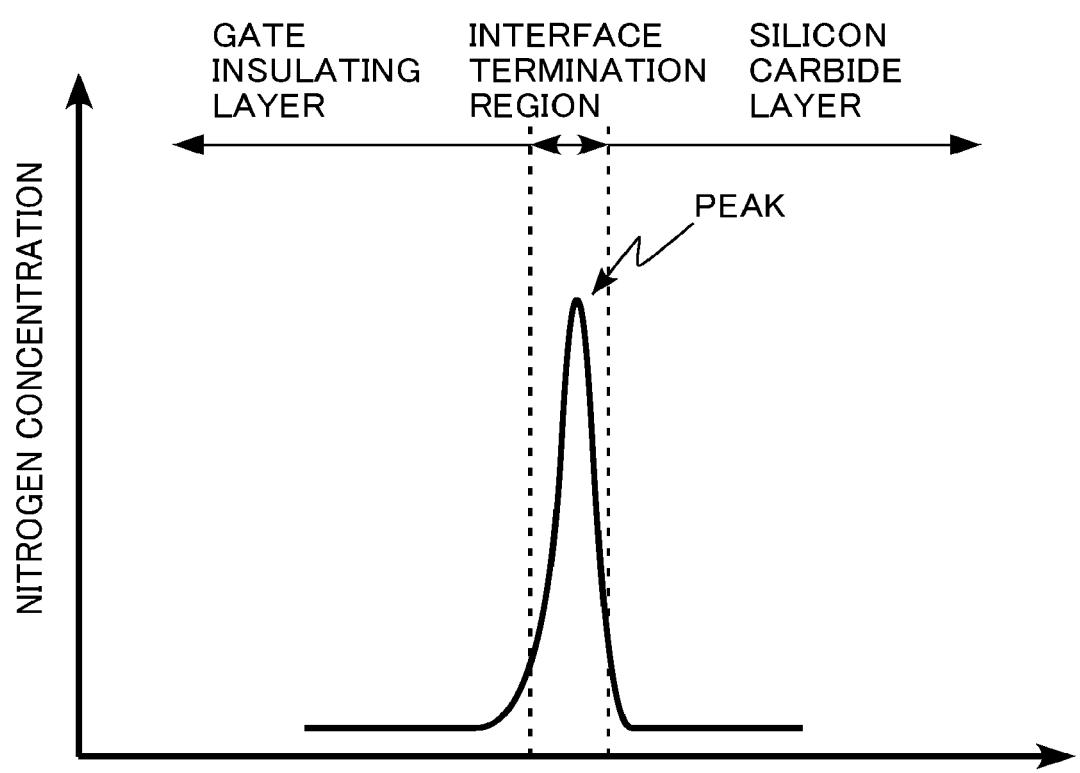
FIG. 3 is a diagram showing nitrogen concentration distribution of the semiconductor device manufactured by the method for manufacturing the semiconductor device according to the first embodiment.

FIG. 3 is a diagram showing nitrogen concentration distribution of the semiconductor device manufactured by the method for manufacturing the semiconductor device according to the first embodiment.

Nitrogen is segregated at an interface between the drift layer 14 and the p-well region 16 and the gate insulating layer 28. The nitrogen concentration distribution has a peak in the interface termination region 40. A full width at half maximum with respect to the peak of the nitrogen concentration distribution is, for example, equal to or less than 1 nm.

Nitrogen substitutes outermost carbon atoms of the drift layer 14 and the p-well region 16. Nitrogen is three-coordinated with the silicon carbide layer. In other words, nitrogen is at positions of carbon atoms in a crystal lattice of silicon carbide.

A peak nitrogen concentration of the nitrogen concentration distribution in the interface termination region 40 is, for example, equal to or more than $4 \times 10^{19}$ cm$^{-3}$ and equal to or less than $4 \times 10^{23}$ cm$^{-3}$. In order to ensure the termination, the peak nitrogen concentration is preferably equal to or more than $1 \times 10^{21}$ cm$^{-3}$. On the other hand, if there is excess nitrogen, this causes charge trapping, so that the peak nitrogen concentration is preferably equal to or less than $1 \times 10^{23}$ cm$^{-3}$. The peak nitrogen concentration is more preferably equal to or more than $1 \times 10^{21}$ cm$^{3}$ and equal to or less than $1 \times 10^{23}$ cm$^{3}$. Typically, the peak nitrogen concentration is about $5.0 \times 10^{22}$ cm$^{-3}$ (±5%), which shows good characteristics without charge trapping. An area density at the interface is preferably equal to or more than $1 \times 10^{14}$ cm$^{-2}$ and equal to or less than $2.5 \times 10^{15}$ cm$^{-2}$. Typically, the area density is about $1.4 \times 10^{15}$ cm$^{-2}$ (±5%), which shows good characteristics without charge trapping.

The concentration and distribution of nitrogen in the interface termination region 40 can be measured by secondary ion mass spectrometry (SIMS), for example.

The concentration of nitrogen in the gate insulating layer 28 and the silicon carbide layer is, for example, equal to or less than $2 \times 10^{16}$ cm$^{-3}$.

Figure 4A:
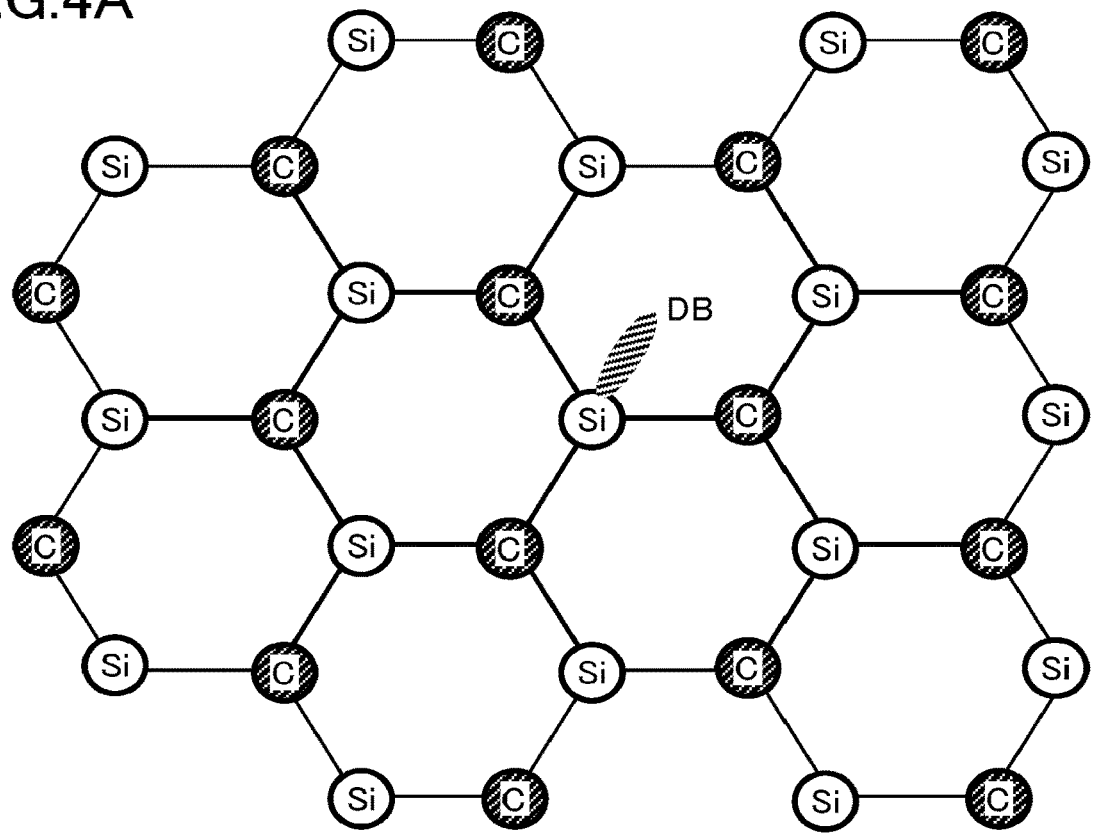
FIGS. 4A and 4B are diagrams illustrating an interface termination region of the semiconductor device manufactured by the method for manufacturing the semiconductor device according to the first embodiment.
Figure 4B:
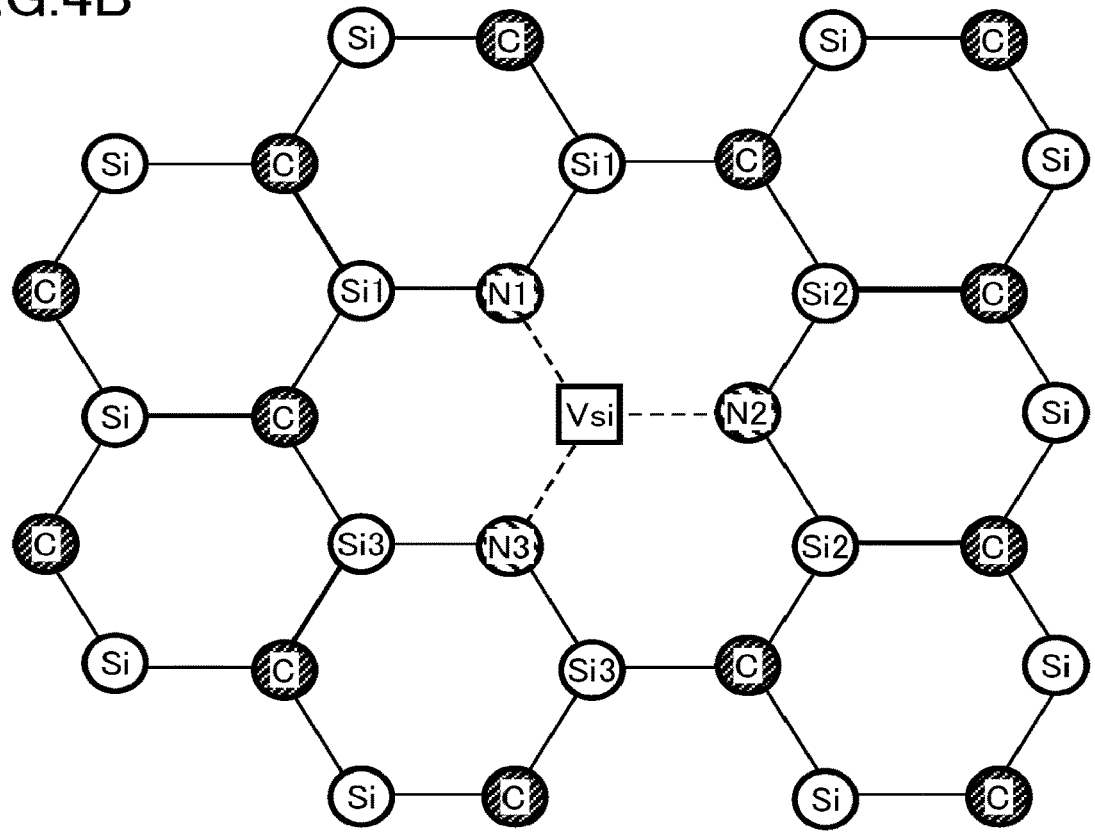

FIGS. 4A and 4B are diagrams illustrating the interface termination region of the semiconductor device manufactured by the method for manufacturing the semiconductor device according to the first embodiment. FIG. 4A is a diagram illustrating a dangling bond of silicon. FIG. 4B is a diagram illustrating a bond structure in which three nitrogen atoms of three-coordination are adjacent to each other. FIGS. 4A and 4B are top views of the silicon face of SiC. Silicon atoms (Si) are arranged on the outermost face and carbon atoms (C) are arranged behind the outermost face.

As shown in FIG. 4A, for example, one silicon atom (Si) has a dangling bond (DB). The other silicon atoms (Si) are bonded to oxygen atoms in silicon oxide (not shown), for example.

The interface termination region 40 of the first embodiment includes a first bond structure shown in FIG. 4B. The interface termination region 40 of the first embodiment includes a first bond structure in which three nitrogen atoms of three-coordination are adjacent to each other.

The first bond structure has a first nitrogen atom (N1) of three-coordination bonded to three first silicon atoms (Si1), a second nitrogen atom (N2) of three-coordination bonded to three second silicon atoms (Si2), and a third nitrogen atom (N3) of three-coordination bonded to three third silicon atoms (Si3).

The first nitrogen atom (N1), the second nitrogen atom (N2), and the third nitrogen atom (N3) are adjacent to each other. There is no direct bond between the first nitrogen atom (N1), the second nitrogen atom (N2), and the third nitrogen atom (N3).

In FIG. 4B, one of the three first silicon atoms (Si1), one of the three second silicon atoms (Si2), and one of the three third silicon atoms (Si3) are not shown. These silicon atoms exist immediately below the first nitrogen atom (N1), the second nitrogen atom (N2), and the third nitrogen atom (N3) at the back side of a plane of paper.

The first bond structure is a structure in which the three carbon atoms bonded to the silicon atom having the dangling bond shown in FIG. 4A are substituted by nitrogen atoms of three-coordination, respectively. The position of the silicon atom having the dangling bond is a silicon vacancy (Vsi).

The gate electrode 30 is provided on the gate insulating layer 28. The gate electrode 30 sandwiches the gate insulating layer 28 between the drift layer 14 and the gate electrode 30.

For example, polycrystalline silicon including n-type impurities or p-type impurities can be applied to the gate electrode 30.

The interlayer insulating film 32 is formed on the gate electrode 30. The interlayer insulating film 32 is, for example, a silicon oxide film.

The source electrode 34 is electrically connected to the source region 18 and the p-well contact region 20.

The source electrode 34 also functions as a p-well electrode for applying a potential to the p-well region 16.

The source electrode 34 is formed of, for example, a stacked layer of a barrier metal layer of nickel (Ni) and a metal layer of aluminum on the barrier metal layer. The barrier metal layer of nickel and the silicon carbide layer may react to form nickel silicide (NiSi, $Ni_2Si$, or the like). The barrier metal layer of nickel and the metal layer of aluminum may form an alloy by reaction.

The drain electrode 36 is provided on the side of the silicon carbide substrate 12 opposite to the drift layer 14, that is, the back surface side. The drain electrode 36 is, for example, nickel. Nickel may react with the silicon carbide substrate 12 to form nickel silicide (NiSi, $Ni_2Si$, or the like).

In the first embodiment, the n-type impurity is, for example, nitrogen or phosphorus. Arsenic (As) or antimony (Sb) can also be applied as the n-type impurity.

Further, in the first embodiment, the p-type impurity is, for example, aluminum. Boron (B), gallium (Ga), and indium (In) can also be applied as the p-type impurity.

Next, the method for manufacturing the memory device according to the first embodiment will be described.

Figure 5:
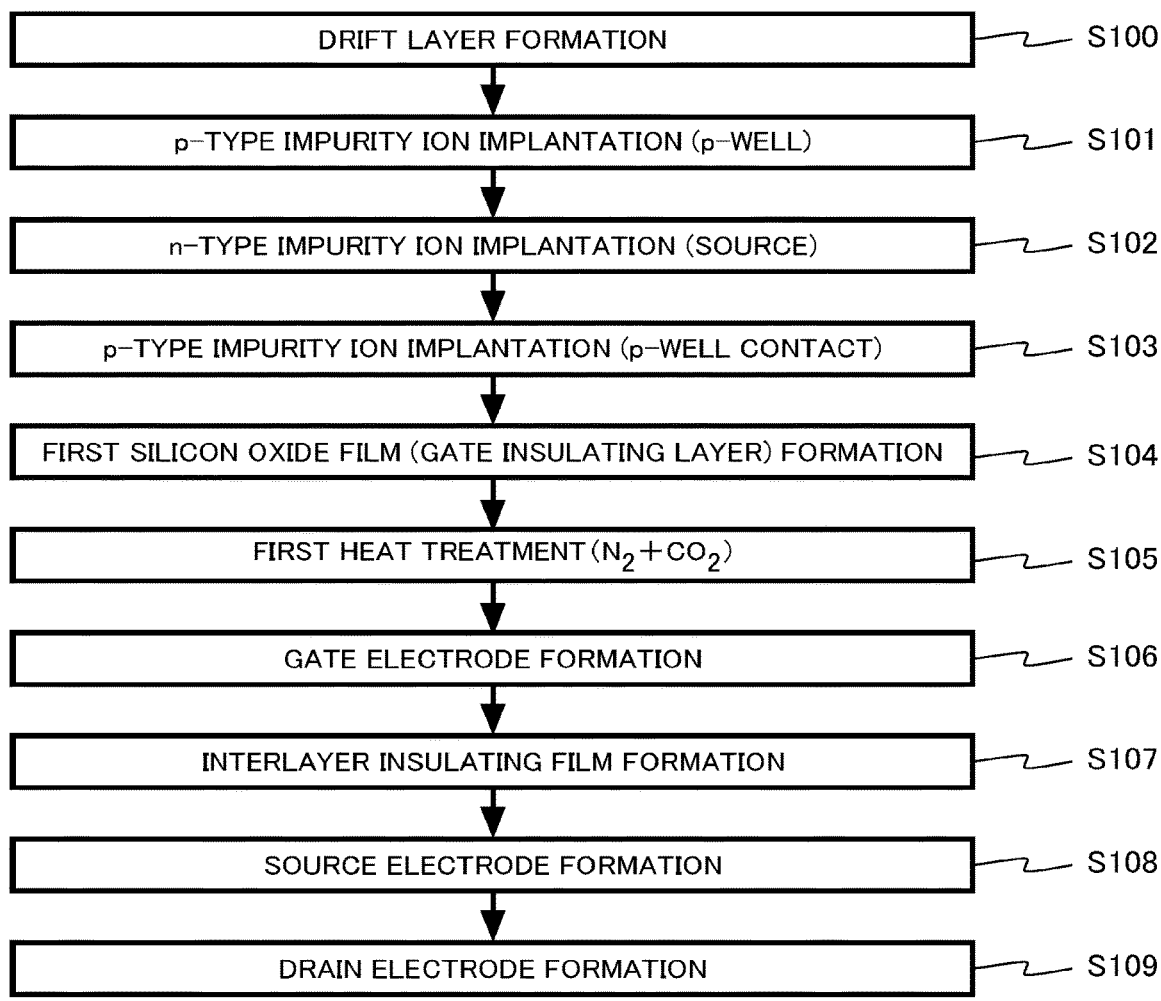
FIG. 5 is a process flow diagram of the method for manufacturing the semiconductor device according to the first embodiment.

FIG. 5 is a process flow diagram of the method for manufacturing the semiconductor device according to the first embodiment.

As shown in FIG. 5, the method for manufacturing the semiconductor device according to the first embodiment includes drift layer formation (step S100), p-type impurity ion implantation (step S101), n-type impurity ion implantation (step S102), p-type impurity ion implantation (step S103), first silicon oxide film formation (step S104), first heat treatment (step S105), gate electrode formation (step S106), interlayer insulating film formation (step S107), source electrode formation (step S108), and drain electrode formation (step S109).

First, the $n^+$-type silicon carbide substrate 12 is prepared. The silicon carbide substrate 12 is, for example, 4H—SiC. The silicon carbide substrate 12 is, for example, a silicon carbide wafer. The surface of the silicon carbide substrate 12 is, for example, a face inclined by equal to or more than 0 and equal to or less than 8 degrees with respect to the silicon face.

The silicon carbide substrate 12 includes nitrogen as n-type impurities. An n-type impurity concentration of the silicon carbide substrate 12 is, for example, equal to or more than $1\times10^{18}$ $cm^{-3}$ and equal to or less than $1\times10^{20}$ $cm^{-3}$. The thickness of the silicon carbide substrate 12 is, for example, 350 μm. The silicon carbide substrate 12 may be thinned to about 90 μm before forming the drain electrode 36 of the back surface.

In step S100, the drift layer 14 is formed on the silicon face of the silicon carbide substrate 12 by an epitaxial growth method. The drift layer 14 is 4H—SiC. The surface of the drift layer 14 is a face inclined by equal to or more than 0 and equal to or less than 8 degrees with respect to the silicon face.

The drift layer 14 includes nitrogen as n-type impurities. An n-type impurity concentration of the drift layer 14 is, for example, equal to or more than $5\times10^{15}$ $cm^{-3}$ and equal to or less than $2\times10^{16}$ $cm^{-3}$. The thickness of the drift layer 14 is, for example, equal to or more than 5 μm and equal to or less than 100 μm.

In step S101, first, a first mask material is formed by patterning using photolithography and etching. Then, by using the first mask material as an ion implantation mask, aluminum to be p-type impurities is ion-implanted into the drift layer 14. The p-well region 16 is formed by ion implantation.

In step S102, first, a second mask material is formed by patterning using photolithography and etching. Then, by using the second mask material as an ion implantation mask, nitrogen to be n-type impurities is ion-implanted into the drift layer 14 to form the source region 18.

In step S103, a third mask material is formed by patterning using photolithography and etching. By using the third mask material as an ion implantation mask, aluminum to be p-type impurities is ion-implanted into the drift layer 14 to form the p-well contact region 20.

In step S104, a first silicon oxide film is formed on the silicon carbide layer. The first silicon oxide film becomes the gate insulating layer 28.

The first silicon oxide film is a deposited film formed by, for example, a chemical vapor deposition method (CVD method) or a physical vapor deposition method (PVD method). The thickness of the first silicon oxide film is, for example, equal to or more than 30 nm and equal to or less than 100 nm. The thickness of the first silicon oxide film is, for example, equal to or more than 40 nm and equal to or less than 50 nm.

The first silicon oxide film is, for example, a silicon oxide film formed by the CVD method using tetraethyl orthosilicate (TEOS) as source gas.

In step S105, first heat treatment is performed. The first heat treatment is performed in an atmosphere including nitrogen gas ($N_2$) and carbon dioxide gas ($CO_2$).

The temperature of the first heat treatment is equal to or more than 1200° C. The temperature of the first heat treatment is, for example, equal to or less than 1500° C.

A partial pressure of the carbon dioxide gas in the atmosphere of the first heat treatment is preferably equal to or more than 20% and equal to or less than 90% at 1200° C., for example. The partial pressure of the carbon dioxide gas is preferably equal to or more than 10% and equal to or less than 70% at 1300° C. The partial pressure of the carbon dioxide gas is preferably equal to or more than 10% and equal to or less than 50% at 1400° C. The partial pressure of the carbon dioxide gas is preferably equal to or more than 10% and equal to or less than 30% at 1500° C. It is preferable to set the partial pressure of the carbon dioxide gas lower as the treatment temperature becomes higher. However, for sufficient reaction of $CO_2$, the partial pressure of the carbon dioxide gas is preferably equal to or more than 10%. The partial pressure of nitrogen gas in the atmosphere of the first heat treatment is preferably equal to or more than 30% and equal to or less than 80% at 1200° C., for example. The partial pressure of the carbon dioxide gas is preferably equal to or more than 30% and equal to or less than 90% at equal to or more than 1300° C. and equal to or less than 1500° C. More preferably, the partial pressure of the carbon dioxide gas is equal to or more than 50% and equal to or less than 80%. Since the partial pressure of $CO_2$ preferably decreases as the temperature increases, the partial pressure of nitrogen increases. The partial pressure of nitrogen is preferably at least 30% in order to react nitrogen with the substrate.

The partial pressures of oxygen gas ($O_2$), nitrogen oxide gas ($NO_x$), and water vapor ($H_2O$) in the atmosphere of the first heat treatment are equal to or less than 0.01%. Normally, oxygen is used for a nitrogen termination of the SiC/SiO$_2$ interface. However, in the method for manufacturing the semiconductor device according to the first embodiment, since carbon dioxide gas ($CO_2$) extracts carbon (C), oxygen is unnecessary. Since oxygen is not used, substrate damage due to oxidation does not occur. As a result, hole mobility of the substrate side of the MOS interface increases. When the carbon dioxide gas is not used, the hole mobility is, for example, 120 cm$^2$/Vs. However, by using the carbon dioxide gas, the hole mobility can be improved, for example, by approximately 1.2 times (140 cm$^2$/Vs) to 4 times (500 cm$^2$/Vs). Since field effect mobility may decrease to about 30% of the hole mobility, the hole mobility is preferably equal to or more than 1.75 times (210 cm$^2$/Vs).

By the first heat treatment, the interface termination region 40 is formed at the interface between the p-well region 16 and the first silicon oxide film. In the interface termination region 40, a first bond structure is formed. By the first heat treatment, silicon atoms (Si) having a dangling bond (DB) disappear. By the first heat treatment, the silicon atoms (Si) having the dangling bond (DB) are emitted from the silicon carbide layer.

The first heat treatment also functions as densification annealing of the silicon oxide film. By the first heat treatment, the silicon oxide film becomes a high-density film.

In step S106, the gate electrode 30 is formed on the gate insulating layer 28. The gate electrode 30 is, for example, polycrystalline silicon including n-type impurities or p-type impurities.

In step S107, the interlayer insulating film 32 is formed on the gate electrode 30. The interlayer insulating film 32 is, for example, a silicon oxide film.

In step S108, the source electrode 34 is formed. The source electrode 34 is formed on the source region 18 and the p-well contact region 20. The source electrode 34 is formed by sputtering of nickel (Ni) and aluminum (Al), for example.

In step S109, the drain electrode 36 is formed. The drain electrode 36 is formed on the back surface side of the silicon carbide substrate 12. The drain electrode 36 is formed by, for example, nickel sputtering.

Then, for example, the heat treatment is performed at equal to or more than 400° C. and equal to or less than 1000° C. in an argon gas atmosphere. By the heat treatment, contact resistance of the source electrode 34 and the drain electrode 36 is reduced.

The MOSFET 100 shown in FIG. 1 is formed by the above manufacturing method.

Next, functions and effects of the method for manufacturing the semiconductor device according to the first embodiment will be described.

When the MOSFET is formed using silicon carbide, there is a problem that the mobility of carriers is lowered.

One factor lowering the mobility of the carriers is considered to be an interface state (surface state) between the silicon carbide layer and the gate insulating layer. It is considered that the interface state is caused by the dangling bond existing on the surface of the silicon carbide layer.

In the method for manufacturing the semiconductor device according to the first embodiment, the interface termination region 40 is formed between the silicon carbide layer and the gate insulating layer 28. The first bond structure is formed in the interface termination region 40, and the dangling bond is reduced. Therefore, a MOSFET in which the mobility of the carriers is suppressed from being lowered is manufactured. The details will be described below.

Figure 6:
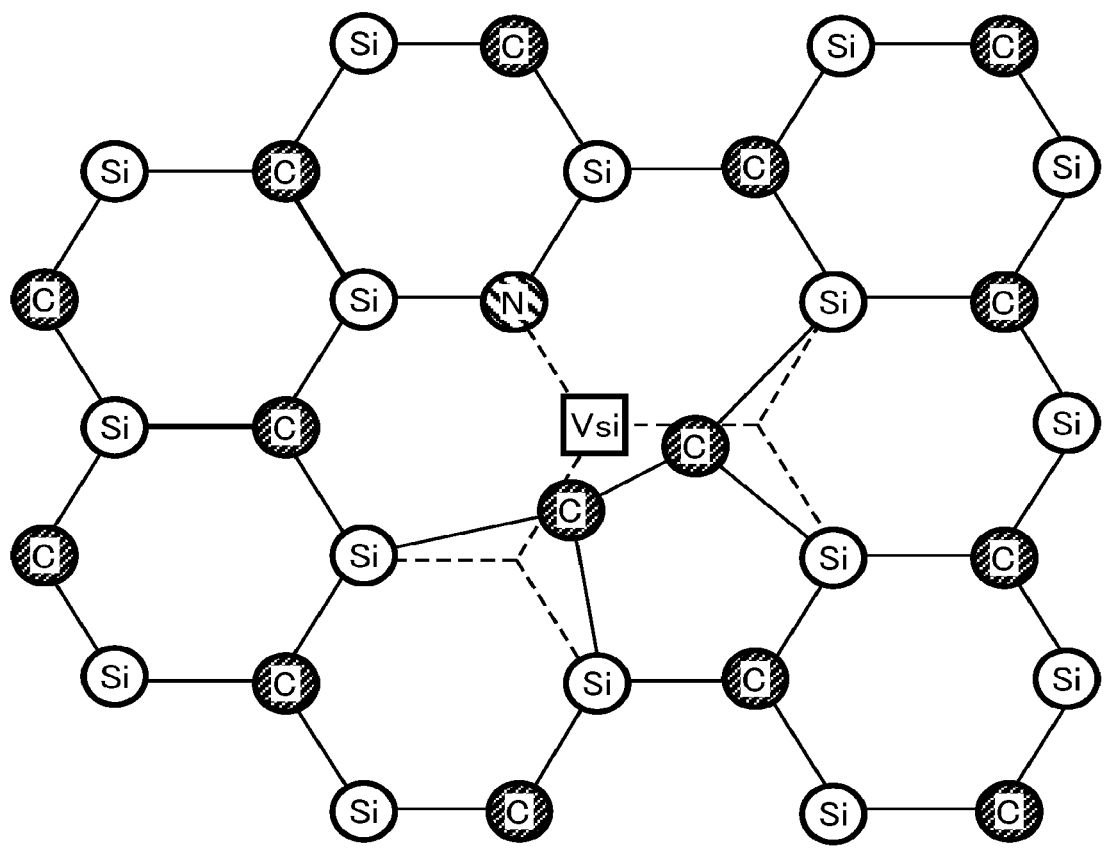
FIG. 6 is a diagram illustrating an interface termination region of a semiconductor device manufactured by a method for manufacturing a semiconductor device according to a comparative example.

FIG. 6 is a diagram illustrating an interface termination region of a semiconductor device manufactured by a method for manufacturing a semiconductor device according to a comparative example. FIG. 6 is a diagram illustrating a second bond structure including one nitrogen atom of three-coordination. FIG. 6 is a top view of a silicon face of SiC. FIG. 6 is a schematic diagram showing a bond state of the second bond structure.

The interface termination region of the semiconductor device according to the comparative example is formed by a manufacturing method using nitric oxide gas (NO), for example. In this case, the second bond structure is mainly formed in the interface termination region.

The second bond structure is a structure in which one of the three carbon atoms bonded to the silicon atom having the dangling bond shown in FIG. 4A is substituted by a nitrogen atom of three-coordination. The remaining two carbon atoms are in a state having σ bonds with each other, so that the second bond structure is stabilized.

By forming the second bond structure, the dangling bond of the silicon atom disappears. The position of the silicon atom having the dangling bond is a silicon vacancy (Vsi).

In the second bond structure, the nitrogen atom of three-coordination is adjacent to the two carbon atoms to be bonded. There is no direct bond between the nitrogen atom of three-coordination and the two carbon atoms.

With the second bond structure, the dangling bond of the silicon atom disappears. However, by the 6 bond between the two carbon atoms in the second bond structure, a Si—C distance between the carbon atoms and Si to be bonded increases. As a result, it has been clarified by a first principle calculation by the inventors that an energy level can be generated in a band gap of an insulating film. The energy level can cause a variation in threshold voltage of the MOSFET.

It has been clarified by the first principle calculation by the inventors that the first bond structure exists stably on the surface of the silicon carbide layer. The first bond structure is a structure in which the three carbon atoms bonded to the silicon atom having the dangling bond are substituted by the nitrogen atoms of three-coordination, respectively. Therefore, the dangling bond is reduced on the surface of the silicon carbide layer. As a result, the interface state is reduced, and reduction of the mobility of the carriers in the MOSFET 100 is suppressed. Further, unlike the second bond structure, no energy level is generated in the band gap of the insulating film.

The first bond structure in which the three nitrogen atoms of three-coordination are adjacent to each other has extremely high stability, so that the structure is unlikely to be collapsed even during the operation of the MOSFET 100. Therefore, the MOSFET 100 with high reliability is realized.

For example, when the interface termination region is formed using the heat treatment with nitric oxide gas (NO), the silicon carbide layer is oxidized simultaneously with the reaction of nitrogen with the silicon carbide layer. In order for nitrogen to react with the silicon carbide layer, it is necessary to find an optimum solution during a conflict between nitriding of the silicon carbide layer and oxidation of the silicon carbide layer. If oxidation power of the heat treatment is strong, the oxidation of the silicon carbide layer proceeds, so that it is difficult to stably form the first bond structure.

Further, if the silicon carbide layer is oxidized at the time of forming the interface termination region, carbon generated by the oxidation diffuses into the gate insulating layer. By carbon having diffused into the gate insulating layer, carbon defects occur in the gate insulating layer. The carbon defects are, for example, a double bond between carbon atoms, carbon of three-coordination in which three silicon atoms are coordinated, and a structure in which oxygen atoms are double-bonded to carbon atoms. It has been clarified by the first principle calculation by the inventors that these carbon defects form trap levels due to Pz orbitals.

The presence of the carbon defects forming the trap levels may cause, for example, a variation in threshold voltage of the MOSFET or an increase in leakage current of the gate insulating layer.

In the method for manufacturing the semiconductor device according to the first embodiment, the first heat treatment for forming the interface termination region is performed at a temperature of 1200° C. or more, in an atmosphere including nitrogen gas and carbon dioxide gas. By the first heat treatment, the first bond structure can be stably formed in the interface termination region 40. Therefore, a MOSFET in which the mobility of the carriers is suppressed from being lowered can be realized.

Oxidation with carbon dioxide gas has weaker oxidation power than oxidation with nitric oxide gas (NO), for example. For this reason, it is considered that oxidation of silicon atoms having the dangling bond proceeds selectively.

Nitrogen gas of 1200° C. or more has high reactivity. It is considered that the carbon atoms bonded to the silicon atom having the dangling bond are selectively substituted by nitrogen atoms by the nitrogen gas with the high reactivity. In this way, the first bond structure is stably formed.

If the structure having the dangling bond of silicon existing on the surface of the silicon carbide layer is converted into the first bond structure to be energetically stable by the first heat treatment, in the first heat treatment having the weak oxidation power, the oxidation of the surface of the silicon carbide layer hardly progresses. Therefore, carbon generated by the oxidation is suppressed from diffusing into the gate insulating layer. As a result, the carbon defects are suppressed from occurring in the gate insulating layer, and for example, a variation in the threshold voltage of the MOSFET or an increase in the leakage current of the gate insulating layer is suppressed, thereby improving the reliability of the MOSFET.

Further, the carbon defects in the gate insulating layer can be rendered harmless by the first heat treatment. For example, the carbon defects in the gate insulating layer are converted into nitrogen of three-coordination in which three silicon atoms are coordinated by reaction with nitrogen gas and carbon dioxide gas. Thereby, the trap levels in the gate insulating layer are reduced. Therefore, for example, a variation in the threshold voltage or an increase in the leakage current of the gate insulating layer is suppressed, and the reliability of the MOSFET is improved.

From the viewpoint of accelerating formation of the first bond structure in the interface termination region, the temperature of the first heat treatment is preferably 1300° C. or more and is more preferably 1350° C. or more. Further, from the viewpoint of suppressing excessive oxidation of the surface of the silicon carbide layer, the temperature of the first heat treatment is preferably 1500° C. or less and is more preferably 1400° C. or less.

From the viewpoint of accelerating formation of the first bond structure in the interface termination region, a partial pressure of carbon dioxide gas in the atmosphere of the first heat treatment is preferably equal to or more than 10%. Further, a partial pressure of nitrogen gas in the atmosphere of the first heat treatment is preferably equal to or more than 30%.

From the viewpoint of suppressing excessive oxidation of the surface of the silicon carbide layer, partial pressures of oxygen gas, nitrogen oxide gas, and water vapor in the atmosphere of the first heat treatment are preferably equal to or less than 0.01% and are more preferably equal to or less than 0.001%.

As described above, according to the method for manufacturing the semiconductor device according to the first embodiment, a MOSFET in which the mobility of the carriers is suppressed from being lowered is realized. Further, a MOSFET with high reliability is realized.

Second Embodiment

A method for manufacturing a semiconductor device according to a second embodiment is different from a method for manufacturing a semiconductor device according to the first embodiment in that first heat treatment has a first step of 1300° C. or more and a second step having a lower temperature and a longer time than the first step. Hereinafter, description of contents overlapping with those of the first embodiment will be partially omitted.

In step S105 shown in FIG. 5, the first heat treatment is performed. The first heat treatment has the first step of 1300° C. or more and the second step having a lower temperature and a longer time than the first step.

Both the first step and the second step are performed in an atmosphere including nitrogen gas and carbon dioxide gas.

The temperature of the first step is, for example, equal to or more than 1300° C. and equal to or less than 1500° C. The processing time of the first step is, for example, 5 minutes to 20 minutes.

The temperature of the second step is, for example, equal to or more than 1200° C. and equal to or less than 1250° C. The processing time of the second step is, for example, equal to or more than 1 hour and equal to or less than 3 hours.

In the first step, an interface termination region 40 is mainly formed. In the second step, carbon defects in a gate insulating layer 28 are mainly rendered harmless. By performing the second step at the low temperature, excessive oxidation of a surface of a silicon carbide layer is suppressed.

As described above, according to the method for manufacturing the semiconductor device according to the second embodiment, a MOSFET in which the mobility of carriers is suppressed from being lowered is realized. Further, a MOSFET with high reliability is realized.

Third Embodiment

A method for manufacturing a semiconductor device according to a third embodiment is different from a method for manufacturing a semiconductor device according to the first embodiment in that second heat treatment is performed at a temperature lower than that of first heat treatment in an oxidizing atmosphere, after the first heat treatment. Hereinafter, description of contents overlapping with those of the first embodiment will be partially omitted.

After the first heat treatment, before forming a gate electrode 30, the second heat treatment is performed. The second heat treatment is performed at the temperature lower than that of the first heat treatment in an oxidizing atmosphere.

The second heat treatment is performed, for example, in an atmosphere with an oxygen partial pressure of equal to or more than 0.1% and equal to or less than 2%. The temperature of the second heat treatment is, for example, equal to or more than 600° C. and equal to or less than 1000° C. From the viewpoint of suppressing excessive oxidation of a surface of a silicon carbide layer, the temperature of the second heat treatment is preferably 800° C. or less.

By the second heat treatment, for example, silicon atoms having dangling bonds existing in a gate insulating layer 28 are oxidized and rendered harmless. Therefore, the reliability of a MOSFET is improved.

As described above, according to the method for manufacturing the semiconductor device according to the third embodiment, a MOSFET in which the mobility of carriers is suppressed from being lowered is realized. Further, a MOSFET with high reliability is realized.

Fourth Embodiment

A method for manufacturing a semiconductor device according to a fourth embodiment is different from a method for manufacturing a semiconductor device according to the first embodiment in that a second silicon oxide film is formed on a first silicon oxide film after first heat treatment. Hereinafter, description of contents overlapping with those of the first embodiment will be partially omitted.

After the first heat treatment, the second silicon oxide film is formed on the first silicon oxide film.

The second silicon oxide film is a deposited film formed by a CVD method or a PVD method, for example.

The thickness of the second silicon oxide film is larger than the thickness of the first silicon oxide film, for example. The total thickness of the first silicon oxide film and the second silicon oxide film is, for example, equal to or more than 30 nm and equal to or less than 100 nm.

For example, after forming the second silicon oxide film, heat treatment for densification of the second silicon oxide film can be performed in a non-oxidizing atmosphere.

Since the second silicon oxide film is formed after the first heat treatment, an amount of carbon defects or an amount of nitrogen in the second silicon oxide film is small. Therefore, the reliability of a MOSFET is improved.

As described above, according to the method for manufacturing the semiconductor device according to the fourth embodiment, a MOSFET in which the mobility of carriers is suppressed from being lowered is realized. Further, a MOSFET with high reliability is realized.

Fifth Embodiment

A method for manufacturing a semiconductor device according to a fifth embodiment is different from a method for manufacturing a semiconductor device according to the first embodiment in that a first silicon oxide film is a thermal oxide film. Hereinafter, description of contents overlapping with those of the first embodiment will be partially omitted.

In step S104 of FIG. 5, a silicon oxide film is formed on a silicon carbide layer. The silicon oxide film is a thermal oxide film formed by thermally oxidizing the silicon carbide layer. A gate insulating layer 28 is formed of a thermal oxide film.

The thermal oxide film has a higher density and higher reliability than a deposited film. Therefore, a MOSFET with high reliability is realized.

When the first silicon oxide film is the thermal oxide film, a surface of the silicon carbide layer is preferably is a face having an off angle of 8 degrees or less with respect to an Si-face or a face having an off angle of 8 degrees or less with respect to an a-face. This is because, when the surface is the Si-face or the a-face, it is difficult to form a double bond of carbon causing degradation of MOSFET characteristics in a depth direction of the silicon carbide layer by thermal oxidation.

On the other hand, when the surface of the silicon carbide layer is a C-face or an m-face, it is easy to form the double bond of carbon causing degradation of the MOSFET characteristics in the depth direction of the silicon carbide layer by the thermal oxidation. Therefore, the first silicon oxide film is preferably a deposited film.

As described above, according to the method for manufacturing the semiconductor device according to the fifth embodiment, a MOSFET in which the mobility of carriers is suppressed from being lowered is realized. Further, a MOSFET with high reliability is realized.

Sixth Embodiment

A method for manufacturing a semiconductor device according to a sixth embodiment is different from a method for manufacturing a semiconductor device according to the first embodiment in that the method is a method for manufacturing a trench gate type MOSFET including a gate electrode in a trench. Further, the method for manufacturing the semiconductor device according to the sixth embodiment is different from the method for manufacturing the semiconductor device according to the first embodiment in that a surface of a silicon carbide layer facing a gate insulating layer is a face having an off angle of 8 degrees or less with respect to an m-face. Hereinafter, description of contents overlapping with those of the first embodiment will be partially omitted.

Figure 7:
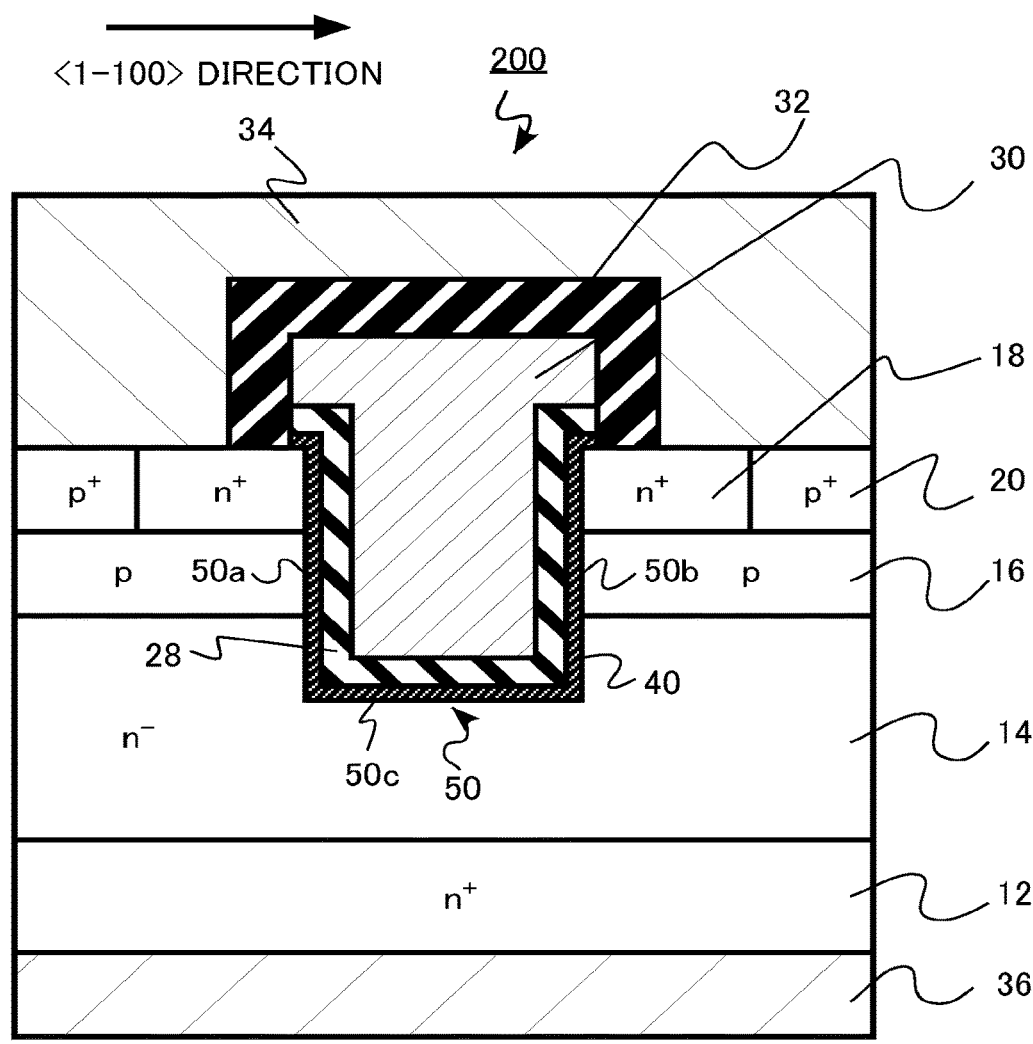
FIG. 7 is a schematic cross-sectional view of a semiconductor device manufactured by a method for manufacturing a semiconductor device according to a sixth embodiment.

FIG. 7 is a schematic cross-sectional view of a semiconductor device manufactured by the method for manufacturing the semiconductor device according to the sixth embodiment. The semiconductor device according to the sixth embodiment is a MOSFET 200. The MOSFET 200 is a trench gate type MOSFET including a gate electrode in a trench. Further, the MOSFET 200 is an n-channel MOSFET using electrons as carriers.

The MOSFET 200 includes a silicon carbide substrate 12, a drift layer 14 (silicon carbide layer), a p-well region 16 (silicon carbide layer), a source region 18, a p-well contact region 20, a gate insulating layer 28, a gate electrode 30, an interlayer insulating film 32, a source electrode 34, a drain electrode 36, an interface termination region 40, and a trench 50. The trench 50 has a first side face 50a, a second side face 50b, and a bottom face 50c.

A surface of the silicon carbide substrate 12 has an off angle of equal to or more than 0 and equal to or less than 8 degrees with respect to a silicon face. An off direction of the surface of the silicon carbide substrate 12 is, for example, a <11-20> direction.

The trench 50 penetrates the source region 18 and the p-well region 16 and reaches the drift layer 14. The bottom face 50c of the trench 50 is located in the drift layer 14.

In the trench 50, the gate insulating layer 28 and the gate electrode 30 are provided.

The first side face 50a and the second side face 50b of the trench 50 are faces inclined by equal to or more than 0 and equal to or less than 8 degrees with respect to the m face. The first side face 50a and the second side face 50b of the trench 50 have off angles of equal to or more than 0 and equal to or less than 8 degrees with respect to the m face.

The first side face 50a and the second side face 50b of the trench 50 face the gate insulating layer 28. The gate insulating layer 28 is in contact with the first side face 50a and the second side face 50b, for example. The off angles of the first side face 50a and the second side face 50b with respect to the m-face are equal to or more than 0 and equal to or less than 8 degrees. A surface of the p-well region 16 facing the gate insulating layer 28 is a face having off angles of equal to or more than 0 and equal to or less than 8 degrees with respect to the m-face.

Figure 8:
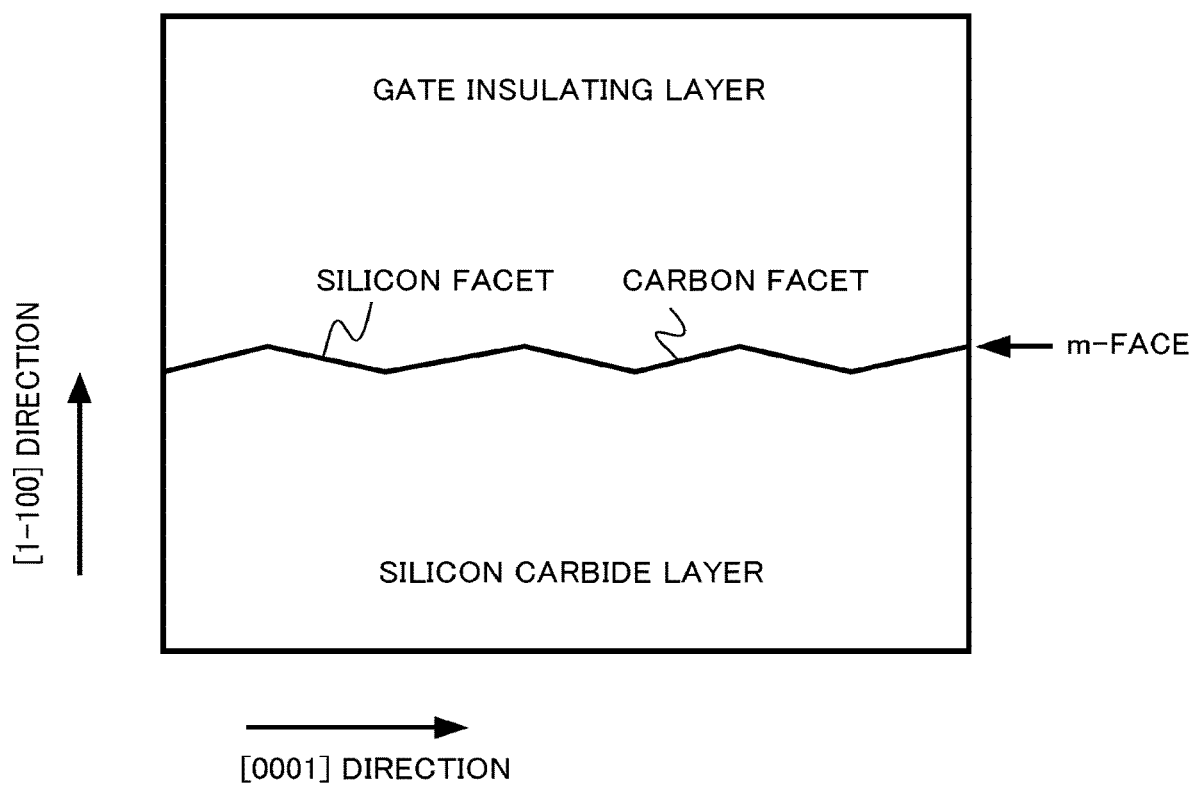
FIG. 8 is a diagram illustrating a face of a silicon carbide layer of the semiconductor device manufactured by the method for manufacturing the semiconductor device according to the sixth embodiment.

FIG. 8 is a diagram illustrating a surface of the silicon carbide layer of the semiconductor device manufactured by the method for manufacturing the semiconductor device according to the sixth embodiment. FIG. 8 is an enlarged schematic view of a surface of the p-well region 16 facing the gate insulating layer 28 of the MOSFET 200. In other words, FIG. 8 is an enlarged schematic view of the first side face 50a or the second side face 50b of the trench 50.

The first side face 50a and the second side face 50b of the trench 50 are faces having off angles of equal to or more than 0 and equal to or less than 8 degrees with respect to the m-face. If the m-face is enlarged, as shown in FIGS. 9A and 9B, silicon facets and carbon facets are alternately disposed on the surface.

A surface of the silicon facet has the same structure as the silicon face. A surface of the carbon facet has the same structure as the carbon face.

In a region including the silicon facet, the interface termination region 40 of the MOSFET 200 has a first bond structure, similarly to the first embodiment. That is, the region including the silicon facet includes a first nitrogen atom of three-coordination bonded to three first silicon atoms.

Figure 9A:
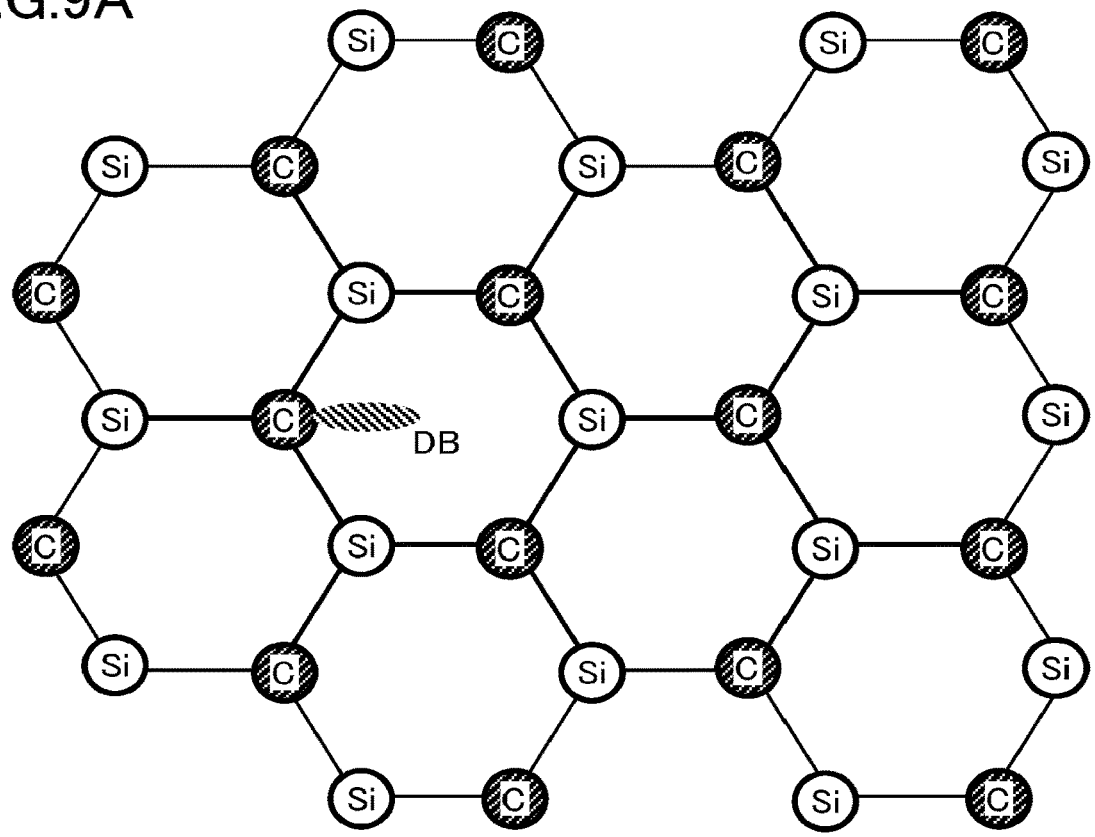
FIGS. 9A and 9B are diagrams illustrating an interface termination region of the semiconductor device manufactured by the method for manufacturing the semiconductor device according to the sixth embodiment.
Figure 9B:
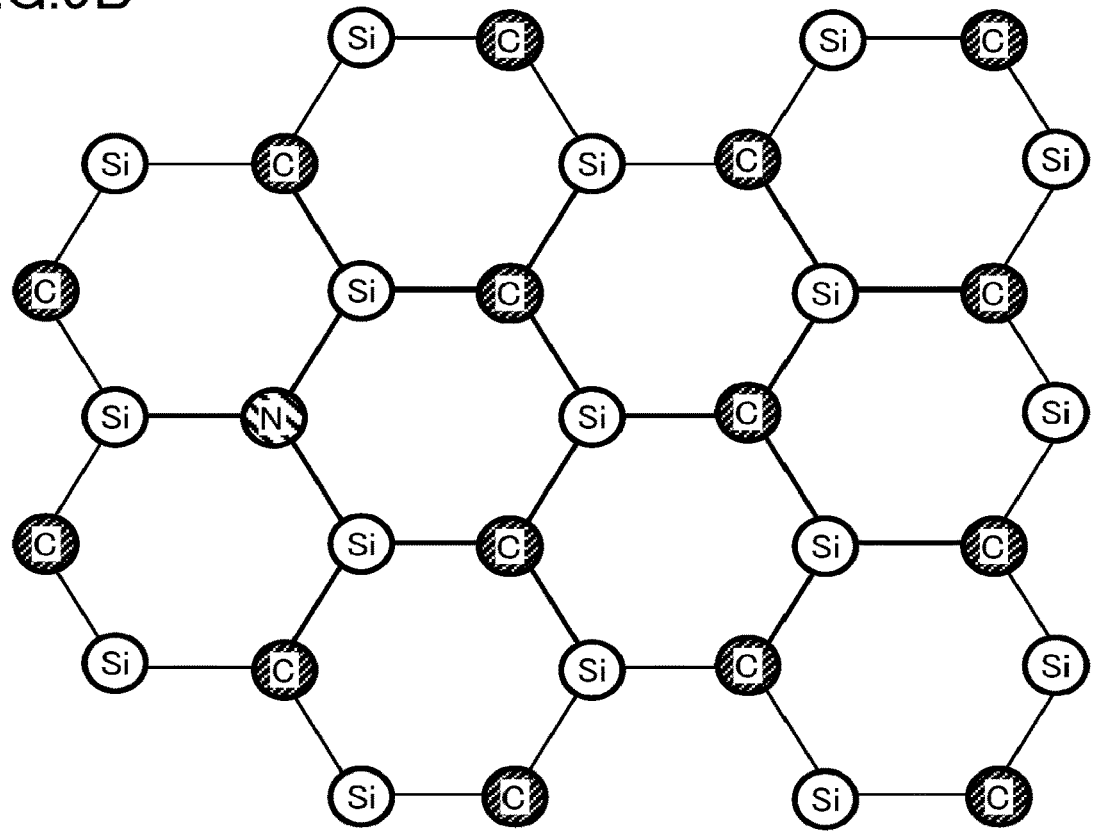

FIGS. 9A and 9B are diagrams illustrating the interface termination region of the semiconductor device manufactured by the method for manufacturing the semiconductor device according to the sixth embodiment. FIGS. 9A and 9B are diagrams illustrating the interface termination region 40 including the carbon facet of the MOSFET 200 according to the sixth embodiment.

FIG. 9A is a diagram illustrating a dangling bond of carbon. FIG. 9B is a diagram illustrating an interface termination structure using nitrogen atoms. FIGS. 9A and 9B are top views of the carbon facet of the m-face of SiC. Carbon atoms (C) are arranged on the outermost face and silicon atoms (Si) are arranged behind the outermost face.

As shown in FIG. 9A, for example, one carbon atom (C) has a dangling bond (DB). Other carbon atoms (C) are bonded to, for example, silicon atoms or oxygen atoms in silicon oxide (not shown).

The interface termination region 40 according to the sixth embodiment includes the interface termination structure shown in FIG. 9B. The interface termination structure is a structure in which the carbon atom (C) having the dangling bond (DB) is substituted by a nitrogen atom (N) of three-coordination. The nitrogen atom (N) is an example of a second nitrogen atom. The second nitrogen atom is three-coordination and is bonded to three second silicon atoms. With the interface termination structure shown in FIG. 9B, the dangling bond of the carbon atoms (C) disappear.

For example, the MOSFET 200 can be manufactured by forming the trench 50 in the silicon carbide layer before forming the first silicon oxide film on the silicon carbide layer in the method for manufacturing the semiconductor device according to the first embodiment.

The interface termination region 40 is formed by the same first heat treatment as the method for manufacturing the semiconductor device according to the first embodiment. By the first heat treatment, the interface termination structure shown in FIG. 9B is stably formed in the interface termination region 40.

From the viewpoint of suppressing a decrease in the mobility of carriers of the MOSFET 200, the surface of the silicon carbide layer facing the gate insulating layer 28 is preferably a face having an off angle of 4 degrees or less with respect to the m-face, and is more preferably a face having an off angle of 2 degrees or less with respect to the m-face.

As described above, according to the sixth embodiment, a MOSFET in which the mobility of carriers is suppressed from being lowered is realized. Further, a MOSFET with high reliability is realized. Further, since the trench gate type is used, a channel density per unit area of a chip is increased, and on-resistance is reduced.

As described above, in the first to sixth embodiments, the case where 4H—SiC is used as the crystal structure of silicon carbide has been described as an example. However, the present disclosure can be applied to silicon carbide of other crystal structure such as 6H—SiC and 3C—SiC.

Further, in the first to sixth embodiments, the case where the gate insulating layer 28 is provided on the silicon face or the m-face of silicon carbide has been described as an example. However, the present disclosure can be applied to a case where the gate insulating layer 28 is provided on other face of silicon carbide, for example, a carbon face, an a face, a (0-33-8) face, or the like.

Further, since charge trapping at the interface between the insulating film and the silicon carbide layer can be eliminated, the present disclosure can also be used for processing for eliminating charge trapping at an interface between a passivation insulating film and the silicon carbide layer in the termination region.

Further, the present disclosure can be applied to an n-channel insulated gate bipolar transistor (IGBT).

Further, the present disclosure can be applied to a p-channel MOSFET or IGBT, in addition to the n-channel MOSFET or IGBT.

While certain embodiments have been described, these embodiments have been presented by way of example only, and are not intended to limit the scope of the inventions. Indeed, the method for manufacturing a semiconductor device described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A method for manufacturing a semiconductor device, comprising:
   forming a first silicon oxide film on a surface of a silicon carbide layer; and
   performing first heat treatment at 1200° C. or more in an atmosphere including nitrogen gas and carbon dioxide gas,
   wherein a partial pressure of the carbon dioxide gas in the atmosphere is equal to or more than 10%.

2. The method for manufacturing a semiconductor device according to claim 1, wherein the first heat treatment is performed at 1500° C. or less.

3. The method for manufacturing a semiconductor device according to claim 1, further comprising:
   forming a gate electrode on the first silicon oxide film after the performing the first heat treatment.

4. The method for manufacturing a semiconductor device according to claim 1, wherein a thickness of the first silicon oxide film is equal to or more than 30 nm and equal to or less than 100 nm.

5. The method for manufacturing a semiconductor device according to claim 1, further comprising:
   forming a second silicon oxide film on the first silicon oxide film after the performing the first heat treatment.

6. The method for manufacturing a semiconductor device according to claim 1, wherein
   the surface is a face having an off angle of 8 degrees or less with respect to an Si-face or a face having an off angle of 8 degrees or less with respect to an a face, and
   the first silicon oxide film is a thermal oxide film.

7. The method for manufacturing a semiconductor device according to claim 1, wherein
   the surface is a face having an off angle of 8 degrees or less with respect to a C-face or a face having an off angle of 8 degrees or less with respect to an m-face, and
   the first silicon oxide film is a deposited film.

8. The method for manufacturing a semiconductor device according to claim 1, wherein a partial pressure of the nitrogen gas in the atmosphere is equal to or more than 30%.

9. The method for manufacturing a semiconductor device according to claim 1, wherein partial pressures of oxygen gas, nitrogen oxide gas, and water vapor in the atmosphere are equal to or less than 0.01%.

10. The method for manufacturing a semiconductor device according to claim 1, wherein the first heat treatment has a first step of 1300° C. or more and a second step having a lower temperature and a longer time than the first step.

11. The method for manufacturing a semiconductor device according to claim 1, further comprising:
    performing second heat treatment at a lower temperature than the first heat treatment in an oxidizing atmosphere after the performing the first heat treatment.

12. A method for manufacturing a semiconductor device, comprising:
    forming a first silicon oxide film on a surface of a silicon carbide layer; and
    performing first heat treatment at 1200° C. or more in an atmosphere including nitrogen gas and carbon dioxide gas,
    wherein a partial pressure of the nitrogen gas in the atmosphere is equal to or more than 30%.

13. A method for manufacturing a semiconductor device, comprising:
    forming a first silicon oxide film on a surface of a silicon carbide layer; and
    performing first heat treatment at 1200° C. or more in an atmosphere including nitrogen gas and carbon dioxide gas,
    wherein partial pressures of oxygen gas, nitrogen oxide gas, and water vapor in the atmosphere are equal to or less than 0.01%.

14. A method for manufacturing a semiconductor device, comprising:
    forming a first silicon oxide film on a surface of a silicon carbide layer; and
    performing first heat treatment at 1200° C. or more in an atmosphere including nitrogen gas and carbon dioxide gas,
    wherein the first heat treatment has a first step of 1300° C. or more and a second step having a lower temperature and a longer time than the first step.

15. A method for manufacturing a semiconductor device, comprising:
    forming a first silicon oxide film on a surface of a silicon carbide layer;
    performing first heat treatment at 1200° C. or more in an atmosphere including nitrogen gas and carbon dioxide gas; and
    performing second heat treatment at a lower temperature than the first heat treatment in an oxidizing atmosphere after the performing the first heat treatment.

16. The method for manufacturing a semiconductor device according to claim 15, wherein the second heat treatment is performed at equal to or more than 600° C. and equal to or less than 1000° C.

17. The method for manufacturing a semiconductor device according to claim 15, wherein the second heat treatment is performed in an atmosphere with an oxygen partial pressure of equal to or more than 0.1% and equal to or less than 2%.

* * * * *